United States Patent
Zeller et al.

(10) Patent No.: US 12,025,686 B2
(45) Date of Patent: Jul. 2, 2024

(54) METHOD FOR SLICE-SPECIFIC CORRECTION OF SCAN DATA RECORDED FOR AT LEAST TWO SLICES SIMULTANEOUSLY BY MEANS OF AN ECHO-PLANAR SIMULTANEOUS MULTI-SLICE TECHNIQUE

(71) Applicant: Siemens Healthcare GmbH, Erlangen (DE)

(72) Inventors: Mario Zeller, Erlangen (DE); Adam Kettinger, Erlangen (DE)

(73) Assignee: Siemens Healthineers AG, Erlangen (DE)

( * ) Notice: Subject to any disclaimer, the term of this patent is extended or adjusted under 35 U.S.C. 154(b) by 0 days.

(21) Appl. No.: 18/226,903

(22) Filed: Jul. 27, 2023

(65) Prior Publication Data

US 2024/0036140 A1 Feb. 1, 2024

(30) Foreign Application Priority Data

Jul. 29, 2022 (DE) ..................... 10 2022 207 892.6

(51) Int. Cl.
*G01V 3/00* (2006.01)
*G01R 33/48* (2006.01)
(Continued)

(52) U.S. Cl.
CPC ...... *G01R 33/5611* (2013.01); *G01R 33/4818* (2013.01); *G01R 33/5608* (2013.01); *G01R 33/5616* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

| 6,043,651 A | 3/2000 | Heid |
| 9,329,254 B2 | 5/2016 | Pfeuffer |

(Continued)

FOREIGN PATENT DOCUMENTS

| DE | 102016218955 A1 | 4/2018 |
| DE | 102018216774 A1 | 4/2020 |
| EP | 3627172 A1 | 3/2020 |

OTHER PUBLICATIONS

Setsompop, Kawin, et al. "Blipped?controlled aliasing in parallel imaging for simultaneous multislice echo planar imaging with reduced g?factor penalty." Magnetic resonance in medicine 67.5 (2012): 1210-1224.; 2012.

(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

A technique for slice-specific correction of scan data recorded for at least two slices simultaneously of an examination object via an EPI-SMS is provided. The technique comprises recording slice separation reference scan data, generating scan data that is to be corrected, and recording phase-encoded navigator signals simultaneously for the at least two slices after an RF excitation pulse radiated into the examination object and before the recording of scan data to be corrected. The at least one navigator signal is recorded for each possible polarity and different phase-encoding of the navigator signals that is used. The technique further comprises separating the navigator signals simultaneously recorded for the at least two slices into single-slice navigator signals using the slice separation reference scan data, determining slice-specific correction data from the single-slice navigator signals, and correcting scan data that is to be corrected by means of the slice-specific correction data.

18 Claims, 5 Drawing Sheets

(51) Int. Cl.
  *G01R 33/56*    (2006.01)
  *G01R 33/561*   (2006.01)
(58) Field of Classification Search
  USPC .......................................................... 324/309
  See application file for complete search history.

(56) References Cited

U.S. PATENT DOCUMENTS

| | | |
|---|---|---|
| 10,162,037 B2 | 12/2018 | Zeller et al. |
| 10,557,903 B2 | 2/2020 | Carinci et al. |
| 11,255,940 B2 | 2/2022 | Zeller |
| 2017/0205487 A1* | 7/2017 | Zeller ................ G01R 33/4835 |
| 2018/0095150 A1 | 4/2018 | Zeller |
| 2020/0000361 A1 | 1/2020 | Zeller |
| 2020/0103484 A1 | 4/2020 | Zeller |
| 2022/0099780 A1 | 3/2022 | Kettinger et al. |

OTHER PUBLICATIONS

Breuer, Felix A. et al.: "Controlled Aliasing in Parallel Imaging Results in Higher Acceleration (CAIPIRINHA) for Multi-Slice Imaging"; in: Magnetic Resonance in Medicine 53: S. 684-691 (2005).

Zahneisen, Benjamin et al. "Three-Dimensional Fourier Encoding of Simultaneously Excited Slices: Generalized Acquisition and Reconstruction Framework," Magnetic Resonance in Medicine, vol. 71, No. 6, pp. 2071-2081, Jun. 2014 // https://doi.org/10.1002/mrm.24875.

\* cited by examiner

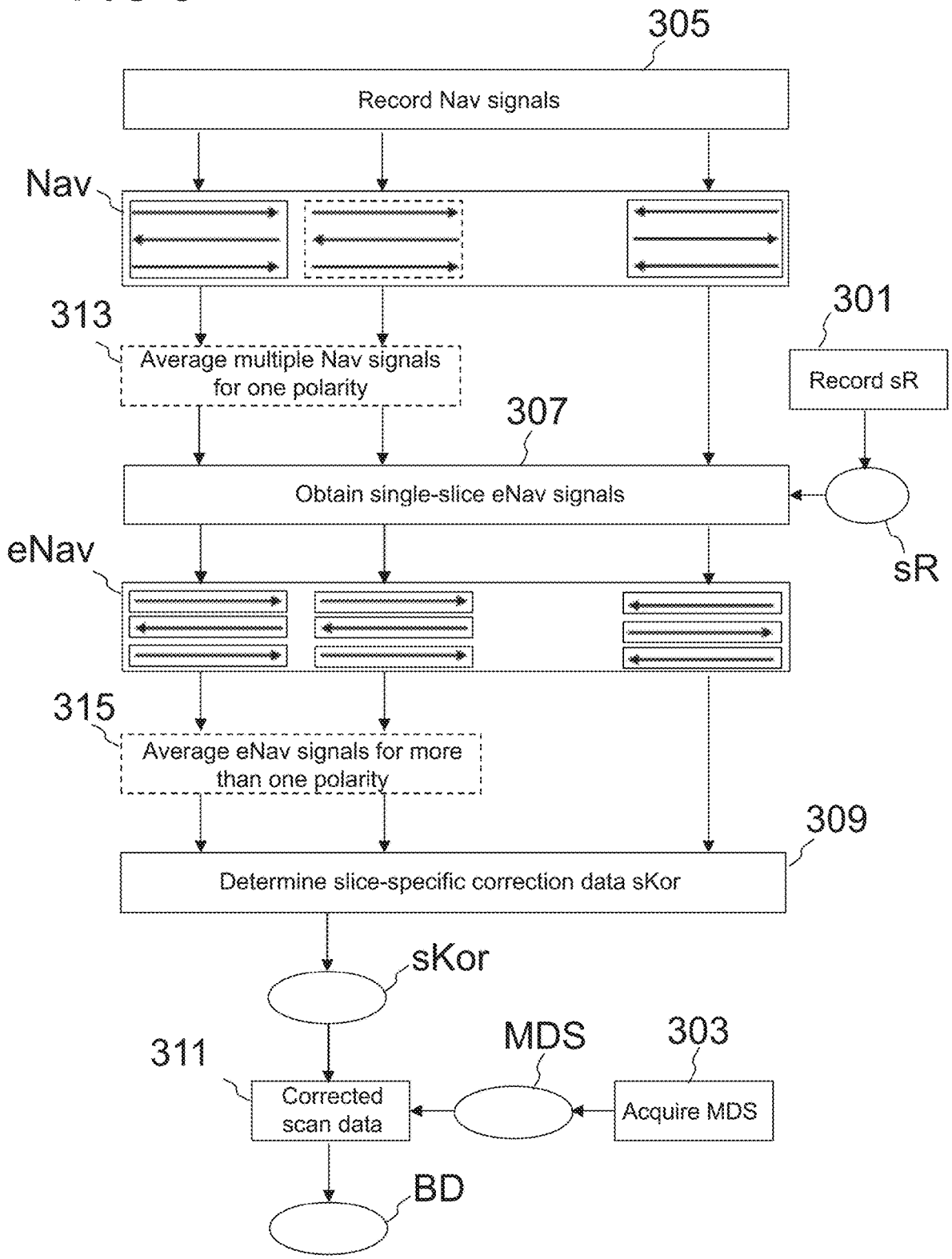

METHOD FOR SLICE-SPECIFIC CORRECTION OF SCAN DATA RECORDED FOR AT LEAST TWO SLICES SIMULTANEOUSLY BY MEANS OF AN ECHO-PLANAR SIMULTANEOUS MULTI-SLICE TECHNIQUE

CROSS-REFERENCE TO RELATED APPLICATIONS

The present application claims priority to and the benefit of Germany patent application no. DE 10 2022 207 892.6, filed on Jul. 29, 2022, the contents of which are incorporated herein by reference in their entirety.

TECHNICAL FIELD

The disclosure relates to performing slice-specific correction of scan data recorded for at least two slices simultaneously via an echo-planar simultaneous multi-slice technique.

BACKGROUND

Magnetic resonance (MR) technology is a known technology with which images of the interior of an examination object can be generated. Expressed simply, for this purpose, the examination object is positioned in a magnetic resonance device in a relatively strong, static, homogeneous main magnetic field, also known as the B0 field, with field intensities of 0.2 tesla to 7 tesla or more, so that its nuclear spins become oriented along the main magnetic field. In order to trigger nuclear spin resonances that are measurable as signals, high-frequency excitation pulses (RF pulses) are radiated into the examination object and the nuclear spin resonances produced are measured as so-called k-space data. On the basis thereof, MR images are reconstructed or spectroscopic data is established. For position encoding of the scan data, rapidly switched magnetic gradient fields known as gradients are overlaid on the main magnetic field. A scheme that is used that defines a temporal sequence of RF pulses to be radiated in, and gradients to be switched, is known as a pulse sequence (scheme) or sequence for short. The recorded scan data is digitized and stored as complex number values in a k-space matrix. From the k-space matrix occupied with values, an associated MR image can be reconstructed, for example by means of a multi-dimensional Fourier transform.

One of the fastest known MR recording techniques is so-called echo-planar imaging (EPI), in which following an RF excitation pulse, an oscillating (i.e. bipolar) readout gradient is used in which each change of the polarization direction of the gradient refocuses the transverse magnetization as far as the T2* decay allows, and thereby generates a gradient echo. In other words, by way of the switching of the bipolar readout gradient following an RF excitation pulse within the free induction decay (FID) following the excitation or, if an RF refocusing pulse is additionally radiated in, following the RF excitation pulse, within the thereby generated spin echo an echo sequence of rising and falling gradient echoes with alternating sign is generated. EPI pulse sequences can be used as a so-called "single-shot" method, in which all the scan data for generating an image of a sub-volume, e.g. a slice of the examination object under investigation is recorded following just one RF excitation pulse.

Due to the alternating polarity of the readout gradient, the scan data obtained from the gradient echo signals must be sorted into a raw data k-space matrix in such a way that the sorting-in direction alternates from line-to-line of the raw data k-space matrix. If, herein, even only slight deviations occur from line-to-line, e.g. due to delays in the gradient switching or eddy currents, this leads to so-called N/2 ghosts, i.e. in an image matrix of N×N points, the actual image is mapped again but displaced by N/2 in the positive and the negative direction relative to the image matrix center, in general with different intensity. For the correction of such N/2 ghosts, it is known for example from U.S. Pat. No. 6,043,651, to record three navigator signals while switching a bipolar readout gradient, with which a correction of phase displacements of zeroth and first order can be carried out in the readout direction between gradient echoes recorded with different polarity, which can correct displacements of this type. For this purpose, a correlation of the recorded navigator signals in the image space is used to determine correction factors that are used in a reconstruction of image data from the gradient echoes recorded as scan data in a raw data k-space matrix, to correct the aforementioned displacements in the raw data k-space matrix.

A further phase correction method named "DORK" for correcting displacements caused by temporal variations, e.g. a drift, of a basic magnetic field applied during an EPI scan in which a navigator signal is recorded is known for example from U.S. Pat. No. 9,329,254. Therein, an evolution of the gradient echoes that have been recorded with one polarity is compared with an evolution of the gradient echoes which have been recorded with the other polarity over successive recordings of raw data k-space matrices. Typically, in such a DORK correction, averaging is undertaken over an entire image volume.

SUMMARY

FIG. 1 shows a schematic pulse sequence diagram that illustrates a temporal sequence of radio frequency (RF) pulses and RF echoes generated in relation to the gradients to be switched in the readout direction (GR) and the phase encoding direction (GP) of an EPI pulse sequence with generation and recording of navigator signals, which can be used for the correction method described above. A representation of the gradients to be switched in the slice direction has been omitted. In the example shown, in a navigator block NB, by switching bipolar readout gradients (GR), three navigator signals N1, N2, N3 are generated as gradient echoes after an RF excitation pulse RF-A. In the phase encoding direction (GP), no gradients are switched in the navigator block NB, i.e. during the generation and the readout of the navigator signals N1, N2, N3. In the example shown, only after the recording of the navigator signals N1, N2, N3 does the generation and recording of scan signals E1, E2, E3, E4, ... begin for the imaging in accordance with an EPI technique with phase encoding according to the gradients switched in the phase encoding direction GP and again with switching of gradients in the readout direction with alternating polarity (bipolar). In the example shown, only one RF excitation pulse RF-A is shown in the excitation block A. However, a plurality of RF pulses can be radiated in within the excitation block A, for example also at least one RF refocusing pulse.

On the basis of such navigator signals N1, N2, N3, both a correction of N/2 ghosts, as mentioned above, and also a DORK correction, also mentioned above, can be carried out.

The desire for ever faster MR recordings in the clinical environment is leading to a resurgence of methods in which a plurality of images are recorded simultaneously. In general, these methods can be characterized in that at least during a part of the scan, targeted transverse magnetization of at least two slices is used simultaneously for the imaging process ("multi-slice imaging" or "slice multiplexing"). In contrast thereto, in the established "multi-slice imaging", the signal is recorded from at least two slices alternatingly, i.e. completely independently of one another with a correspondingly longer scan time.

Known methods of these types, also known as simultaneous multislice (SMS) methods are, for example, the so-called Hadamard encoding, methods with simultaneous echo refocusing, methods with wideband data recording, or methods that use parallel imaging in the slice direction. The latter methods include, for example, the CAIPIRINHA technique as described by Breuer et al. in "Controlled Aliasing in Parallel Imaging Results in Higher Acceleration (CAIPIRINHA) for Multi-Slice Imaging", Magnetic Resonance in Medicine 53, 2005, pp. 684-691 and the blipped CAIPIRINHA technique as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pp. 1210-1224.

Particularly in the latter slice multiplexing method, a so-called multi-band RF pulse is used to excite two or more slices simultaneously or otherwise manipulate them, e.g. to refocus or saturate them. Such a multi-band RF pulse is, for example, a multiplex of individual RF pulses which would be used for manipulation of the individual slices to be manipulated simultaneously. By means of the multiplexing, for example, a baseband-modulated multi-band RF pulse is obtained from an addition of the pulse forms of the individual RF pulses. The position encoding of the recorded signals is achieved substantially by means of a commonly-used gradient switching in two directions (two-dimensional gradient encoding).

The signals arising from all the excited slices are recorded collapsed in one dataset by means of a plurality of receiving antennas and then separated according to the individual slices, for example, with the aid of parallel acquisition techniques.

The aforementioned parallel acquisition (PPA) techniques with the aid of which, in general, acquisition times for recording the desired data can be shortened by way of a sampling that is incomplete according to the Nyquist condition, i.e. an undersampling of the k-space, include, for example GRAPPA ("GeneRalized Autocalibrating Partially Parallel Acquisition") and SENSE ("SENSitivity Encoding"). The scan points in the k-space that are not scanned during the undersampling are typically evenly distributed over the k-space to be scanned according to the Nyquist condition with parallel acquisition techniques, so that for example, every second k-space row is scanned. In addition, the "missing" k-space data is reconstructed in parallel acquisition techniques with the aid of coil sensitivity data. This coil sensitivity data of the receiving coils used during the recording of the scan data is established from reference scan data, which samples fully according to the Nyquist condition at least a region of the k-space to be scanned, typically the central region.

In slice multiplexing methods, parallel acquisition techniques can be used to separate again the scan data recorded simultaneously, and therefore collapsed for different slices. Therein, reference scan data must be recorded for all the slices involved. This typically takes place in the context of a reference scan that is additionally to be performed, which measures the reference scan data individually for each required slice.

To be able to separate the resultant signals of the different slices, for example, a different phase is applied to each of the individual RF pulses before the multiplexing. This can take place, for example, by adding a phase that increases linearly (e.g. with the k-space coordinates in the phase encoding direction (ky)). In this way, each slice can have a different phase gradient applied to it, so that the slices are displaced against one another in the image space. This displacement is controlled by the so-called field of view (FOV) shift factor. How an optimal FOV shift factor can be determined is described, for example, in DE102016218955.

In the CAIPIRINHA methods described in the aforementioned articles by Breuer et al. and Setsompop et al., alternating further phase shifts are applied that generate displacements in the image space in the slice direction ("interslice FoV shifts") by switching additional gradient blips or by additional modulation of the phases of the RF pulses of the multi-band RF pulses between the simultaneously excited slices. These additional displacements in the image space improve the quality of the separation of the signals of the slices, e.g. if the coil sensitivities have such slight differences in the sensitivity profiles of the individual coils used that they are not sufficient for a reliable separation of the slices. Thus, artifacts in the image data that is finally reconstructed from the recorded scan data are lessened.

The effect of the additional phase shifts on the sampling scheme of a two-dimensional (2D) slice multiplexing scan can be described as follows. By way of the additional phases which are applied in slice multiplexing CAIPIRNHA methods, the scan points with the additional phase applied are displaced by a displacement in k-space in the kz-direction. How large this displacement in the kz-direction becomes depends upon the applied phase. This is also described, for example, in the article by Zahneisen et al.: "Three-Dimensional Fourier Encoding of Simultaneously Excited Slices: Generalized Acquisition and Reconstruction Framework", Magn. Reson. Med. 71, pp. 2071-2081 (2014).

The reference scan data from which sensitivity data for separating the simultaneously recorded slices is acquired (e.g. slice separation reference scan data) has conventionally needed to be scanned additionally for each SMS scan.

If, furthermore, an "in-plane" acceleration of the scan data for each slice is used by applying a parallel acquisition technique, further reference scan data must be recorded, from which, due to the scan data not recorded as a result of the dedicated undersampling of the k-space that is peculiar to the parallel acquisition technique, enhancement takes place (e.g. enhancement reference scan data).

Such enhancement reference scan data and/or slice separation reference scan data is usually recorded with an identical recording technique as the scan data to achieve the greatest possible compatibility with the scan data, and thus better results from the enhancement and/or separation. For instance, when an EPI recording technique is used in conjunction with slice multiplexing, due to the sensitivity to eddy currents mentioned above and possible delays to the switched gradients, it is advantageous if the reference scan data is also recorded by means of an EPI sequence.

Furthermore, it can be advantageous to record the slice separation reference scan data and the enhancement reference scan data in separate recordings since, for example, different (under)sampling schemes can be used, which however leads to a different phase accumulation in each case.

In addition, in order for example to achieve a steady state, it can be necessary to carry out so-called dummy scans which already have the acquisition scheme of the following recording of the scan data, the scan data of which, however, are typically discarded.

The additional recordings of the reference scan data and possibly of the dummy scans increases the total required recording time and the SAR (Specific Absorption Rate) loading when a slice multiplexing method is used, and thus reduces the desired advantages in this method of a reduced scan time and SAR loading as compared with single-slice methods.

Possible sequences of scan blocks for recording reference scan data and scan data recorded by means of SMS are illustrated in their temporal sequence in FIGS. 2A-2B.

In the example shown, in the upper line of FIG. 2A, enhancement reference scan data is first recorded for a first slice eR1, and enhancement reference scan data is recorded for a second slice eR2. These two recording blocks are followed by two dummy scans D1, D2, which each create a steady state in one of the aforementioned slices. Following these dummy blocks D1 and D2, there follows recording blocks sR1, sR2 for recording slice separation reference scan data for the individual slices.

In the example shown, the duration of the recording blocks eR1 and eR2 for recording the enhancement reference scan data is shorter than the other recording blocks. This is intended to illustrate that for the recordings of the enhancement reference scan data, a different acquisition technique, for example a known gradient echo (GRE) technique, has been used than for the other recording blocks that use, for example, an EPI technique for recording. It should be noted that the recording blocks D1, D2, sR1 and sR2 each excite only one of the slices mentioned and record the scan data generated, whereas from the recording block Dsms on, an (otherwise preferably identical) recording technique, for example an EPI technique, is used to utilize the aforementioned advantages. A use of a GRE technique for recording enhancement reference scan data is known for saving scan time.

After recording the slice separation reference scan data sR1, sR2, there follows a further dummy scan Dsms, which converts the first and second slice from which scan data is subsequently simultaneously recorded into a steady state. Thereafter, in the example shown, for simplification three recording blocks SMS12a, SMS12b, SMS12c follow in which scan data is recorded in a collapsed form from the first slice and the second slice, and with the aid of the slice separation reference scan data, is then separated into scan data of the individual slices and, with the aid of the enhancement reference data, can be enhanced into complete scan data (as per the Nyquist condition) in k-space.

To reduce the total scan time, it is possible as shown in FIG. 2B with the blocks R1 and R2 to record reference scan data separately for the first slice and the second slice, which can be used both for the aforementioned slice separation and also for the aforementioned enhancement, by means of a GRE technique. In this way, the total scan time is reduced by the timespan Ts that is saved.

Navigator signals for correcting scan signals recorded by means of an EPI technique must themselves be recorded with an EPI technique, as described above in relation to FIG. 1. In a procedure according to that described in relation to FIG. 2A, navigator signals can thus be obtained from the slice separation reference scan data recorded in the recording blocks sR1 and sR2 if it has been recorded by means of an EPI technique. In a procedure according to FIG. 2B, however, reference scan data recorded by means of a GRE technique is not suitable for establishing navigator signals.

If navigator signals are recorded by means of an SMS technique, they are available in collapsed form for the simultaneously recorded slices. Correction factors can, in principle, be established from navigator signals recorded in collapsed form from different slices without phase encoding and applied equally for all the affected slices to the scan data of the corresponding slices. In this way, global effects can be corrected. A slice-specific correction is however not possible due to the impossibility of separating the collapsed non-phase-encoded navigator signals recorded in collapsed form for a plurality of slices into navigator signals of the individual slices.

For example, for an application of a DORK correction as described above, for a plurality of slices, navigator signals that are available in collapsed form can also be used, since DORK corrections typically already average over the imaging volume. Since, however, navigator signals for correcting N/2 ghosts must be recorded without phase encoding gradients, and no possibility is known for separating non-phase-encoded scan data recorded in collapsed form, such navigator signals recorded simultaneously for a plurality of slices in collapsed form are not suitable for a correction as described above of N/2 ghosts. For a correction of N/2 ghosts, navigator data must be acquired for each slice. Slice-specific navigator signals could, however, be obtained for example from a separately recorded slice-specific scan of reference scan data suitable for establishing navigator signals. However, this can lead to severe artifacts if the scan conditions of the scan data recorded for an imaging process change relative to the scan conditions in the recording of reference scan data for establishing navigator signals, e.g. by way of eddy current variations or movements of the examination object.

From U.S. Pat. No. 10,162,037, a method is known in which two sets of phase-encoded navigator signals with opposing polarity and the same strength are recorded in successive scans, in order, with the aid of recorded reference scan data, therefrom to determine non-phase-encoded navigator signals (associated with the central k-space row in the phase-encoding direction), which is suitable for correcting N/2 ghosts. However, the achievable temporal resolution is reduced by way of the required repeated recording of phase-encoded navigator signals, and at the same time an undesirable sensitivity to possible movements of the examination object, even to physiological movements such as breathing movements, is thereby increased. Furthermore, the necessary number of navigator signals corresponds to at least the reference scan data recorded in the phase-encoding direction. The scan time for the navigator signals should, however, be kept as short as possible to keep the total scan time low. Furthermore, in the method described, a minimum achievable echo time in the acquisition of scan data to be corrected is prolonged since the gradients switched during the acquisition of the reference data must be prepared and possibly reversed such that overall, a zero-order moment accumulated in each gradient axis disappears.

U.S. Pat. No. 11,255,940 describes a method which combines a GRE reference scan (e.g. according to FIG. 2B) with a series of recordings of single-slice navigator signals. Although the recordings of the single-slice navigator signals themselves only slightly increase the total scan duration, they do however lead to a disturbance of the steady state so that to compensate for this disturbance, further dummy scans are needed which further increases the total scan time.

For an SMS diffusion imaging process in which, by means of an RF refocusing pulse, refocused echo signals are recorded as scan data for a plurality of slices in collapsed form, in United States patent application publication no. 20220099780A1, a method is described that records navigator signals in collapsed form between the excitation of the echo signals and the recording of the scan data, which (as in U.S. Pat. No. 10,162,037) must still be separated into the respective slices. The method is usable only when using RF refocusing pulses.

It is therefore an object of the disclosure to enable a correction of phase errors in EPI recordings of MR data accelerated by means of slice multiplexing methods, for example for correcting N/2 ghosts and/or drift efficiently, slice-specifically, and with the shortest possible (or at least a reduced) total scan time.

These objects are achieved by the embodiments described herein, which include a method for slice-specific correction of scan data of an examination object recorded for at least two slices simultaneously by means of an EPI SMS technique, a magnetic resonance system, a computer program, and an electronically readable data carrier. The embodiments are described throughout the disclosure, which includes the claims.

A method according to the disclosure for slice-specific correction of scan data recorded for at least two slices simultaneously of an examination object by means of an echo-planar (EPI) simultaneous multi-slice (SMS) technique, comprises:

recording slice separation reference scan data;
generating scan data to be corrected by way, in each case following an RF excitation pulse, of the generation of a train of a plurality of echo signals in a number N, wherein N is at least two, of different slices of the examination object, and recording the echo signals while switching gradients with alternating polarity for successive echo signals, wherein one of also N different phases is applied in the phase-encoding direction to each of successive echo signals, and acquiring the simultaneously recorded echo signals for the at least two slices as scan data in a scan dataset (MDS);
recording phase-encoded navigator signals simultaneously for the at least two slices temporally after an RF excitation pulse radiated into the examination object and temporally before the recording of scan data to be corrected, wherein at least one navigator signal is recorded for each possible polarity and for each different phase-encoding of the navigator signals that is used;
separating the navigator signals simultaneously recorded for the at least two slices, in each case, into single-slice navigator signals of the at least two slices using the slice separation reference scan data;
determining slice-specific correction data from the single-slice navigator signals; and
correcting scan data that is to be corrected by means of the slice-specific correction data.

Image data reconstructed from scan data corrected with slice-specific correction data according to the disclosure has a high image quality, since the correction takes place adapted for the individual slices.

The recording of navigator signals according to the disclosure can take place, for example, temporally between an RF excitation pulse and the train of echo signals associated with the RF excitation pulse if a timing of a pulse sequence scheme that is used makes sufficient temporal space available for the recording according to the disclosure of the navigator signals. This can be the case, for instance, if no minimal echo times are used, e.g. in order to generate a particular contrast or with diffusion scans with a diffusion value of b=0. In this way, the recording of the navigator signals takes place within a recording block in which the scan data to be corrected is also recorded, e.g. in one or more or all of the recording blocks SMS12a, SMS12b, SMS12c of FIG. 2B.

Additionally or alternatively, a recording of navigator signals according to the disclosure can take place in the context of a dummy scan carried out before the generation of the scan data to be corrected, said dummy scan serving for establishing a steady state, for example in a recording block Dsms as shown in FIG. 2B. Such dummy scans already use the same recording technique as the following recording of scan data to be corrected and thus have, for instance, the same temporal sequence of RF pulses and recording windows and thus have significant available recording time to also allow a recording of longer trains of navigator signals. Therein, the navigator signals can even be recorded at a selectable echo time TE in the context of the repetition time TR of the pulse sequence being used.

Thus, the recording of the navigator signals can take place without the total scan time being extended.

A magnetic resonance system according to the disclosure comprises a magnet unit, a gradient unit, a radio-frequency unit, and a control apparatus with a correction data determining unit configured to carrying out any of the methods according to the disclosure as described herein.

A computer program according to the disclosure implements any of the methods according to the disclosure as described herein on a control apparatus when executed on the control apparatus.

Herein, the computer program can also be available in the form of a computer program product that is directly loadable into a memory store of a control apparatus, having program code means to carry out any of the methods according to the disclosure as described herein when the computer program product is executed in the computing unit of the computing system.

An electronically readable data carrier (e.g. a non-transitory computer-readable medium) according to the disclosure comprises electronically readable control information stored thereon, which comprises at least one computer program according to the disclosure and is configured such that, when the data carrier is used in a control apparatus of a magnetic resonance system, it carries out any of the methods according to the disclosure as described herein.

The advantages and embodiments set out in relation to the method apply accordingly to the magnetic resonance system, the computer program product and the electronically readable data carrier.

BRIEF DESCRIPTION OF THE DRAWINGS

Further advantages and details of the present disclosure are disclosed in the exemplary embodiments described below and by reference to the drawings. The examples given do not represent restrictions of the disclosure. In the drawings:

FIG. 3 illustrates a schematic flow diagram of an example method according to the disclosure;

DETAILED DESCRIPTION OF THE DISCLOSURE

FIG. 3 illustrates a schematic flow diagram of an example method according to the disclosure for slice-specific correction of scan data of an examination object recorded for at least two slices simultaneously by means of an EPI SMS technique.

Therein, slice separation reference scan data sR is recorded (block 301).

Furthermore, scan data to be corrected is generated in that, in each case following an RF excitation pulse, a train of a plurality of echo signals is generated in a number N, wherein N is at least two, of different slices of the examination object, and the echo signals are recorded while switching gradients with alternating polarity for successive echo signals, wherein one of also N different phases is applied in the phase-encoding direction to each of successive echo signals. The echo signals recorded simultaneously for the at least two slices are acquired as scan data in a scan dataset MDS (block 303).

Phase-encoded navigator signals Nav are recorded simultaneously for the at least two slices temporally after an RF excitation pulse radiated into the examination object and temporally before the recording of scan data to be corrected (block 305), wherein at least one navigator signal Nav is recorded for each possible polarity and for each different phase-encoding of the navigator signals Nav that is used. Exemplary portions of pulse sequence schemes shown that are suitable for recording the navigator signals Nav are described in relation to FIGS. 4 and 5.

Figure 1:
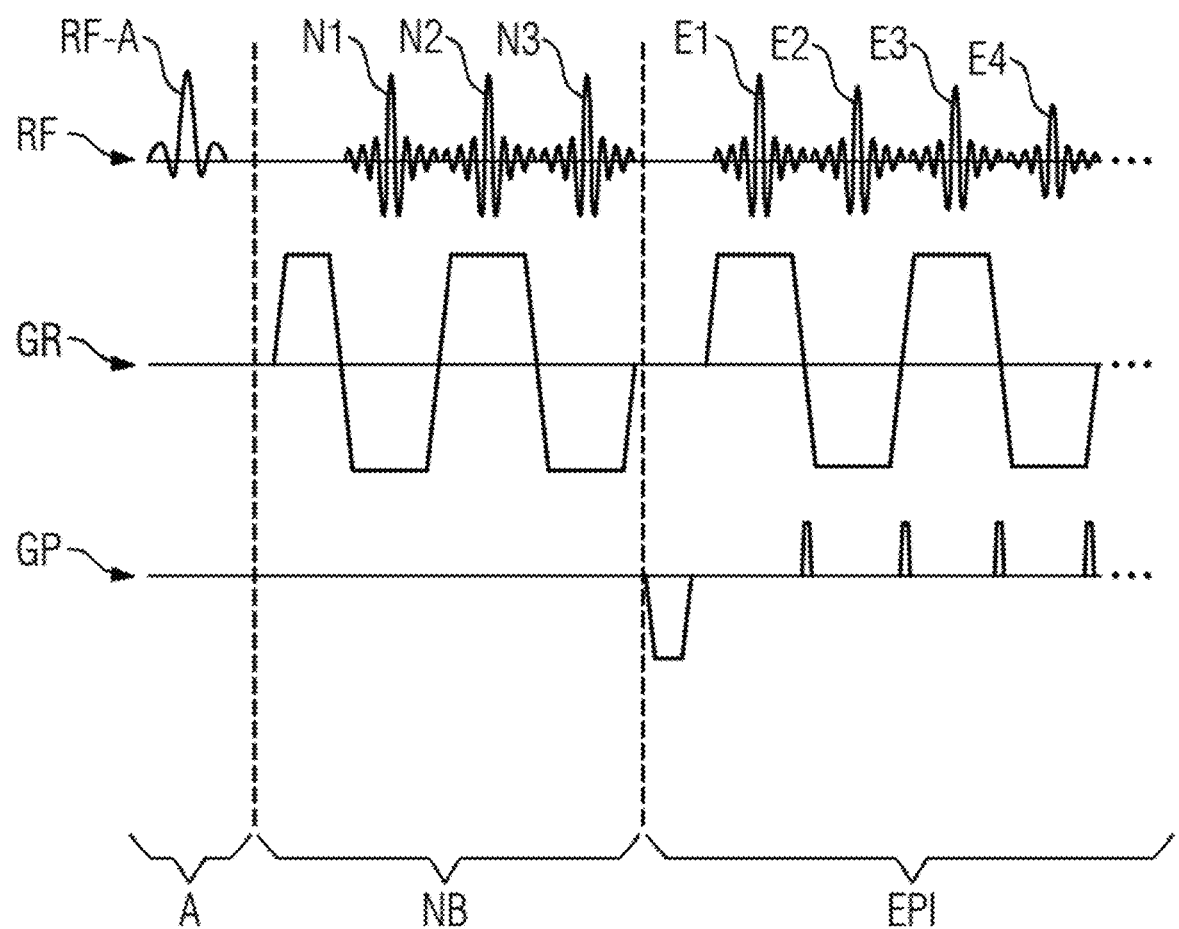
FIG. 1 illustrates a schematic pulse sequence diagram for generating and recording navigator signals N1, N2, N3 for correcting echo signals recorded by means of an EPI technique.
Figure 2A:
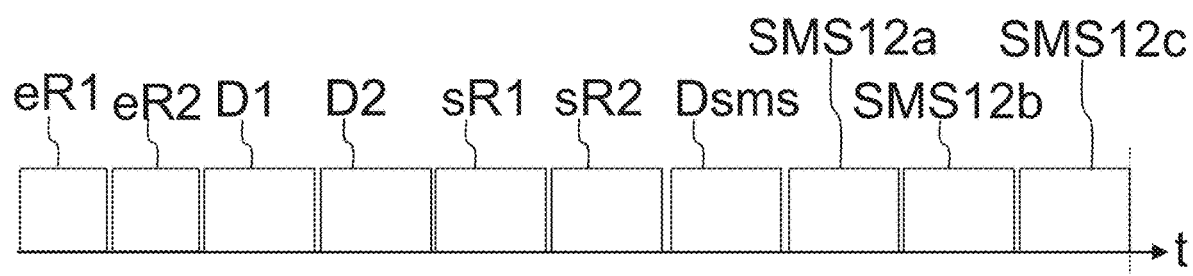
FIGS. 2A-2B illustrate possible sequences of scan blocks for recording reference scan data and scan data recorded by means of SMS in its temporal sequence.
Figure 2B:
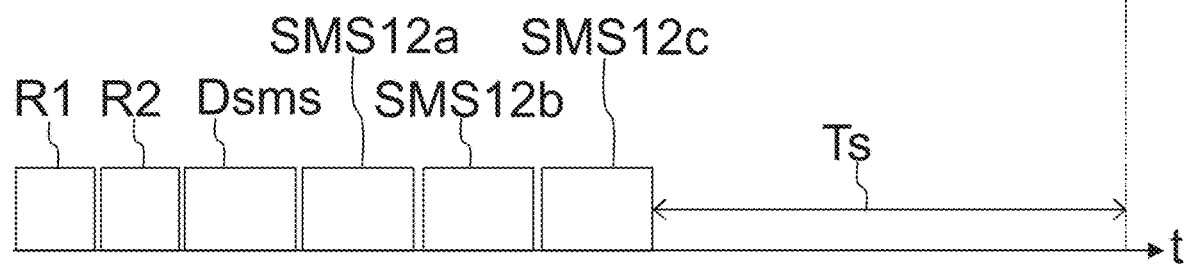
Figure 4:
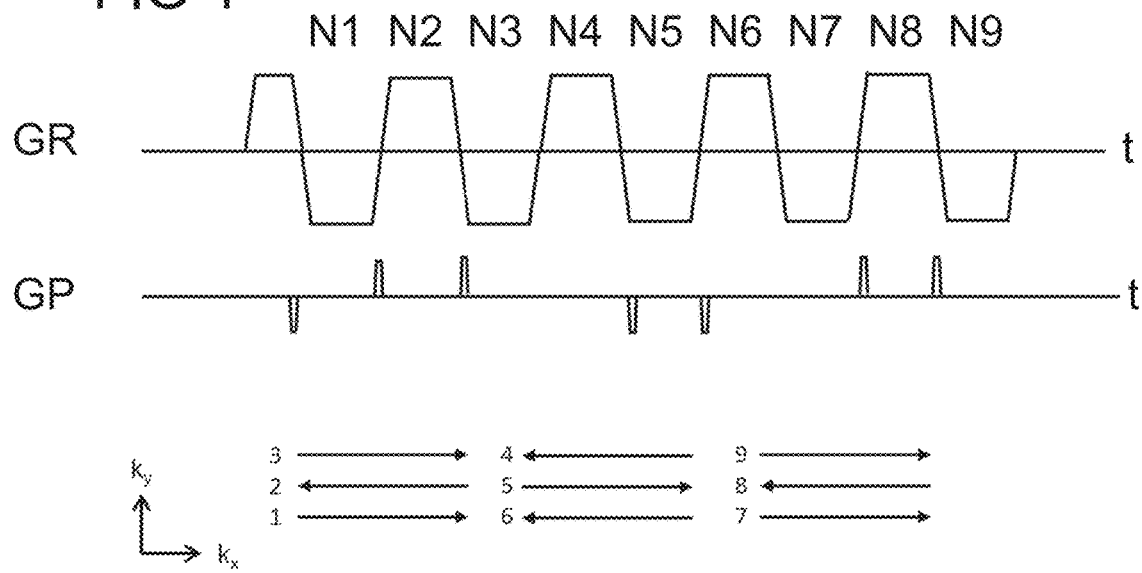
FIGS. 4-5 illustrate schematically portions of example pulse sequence schemes for the acquisition of navigator signals according to the disclosure.
Figure 5:
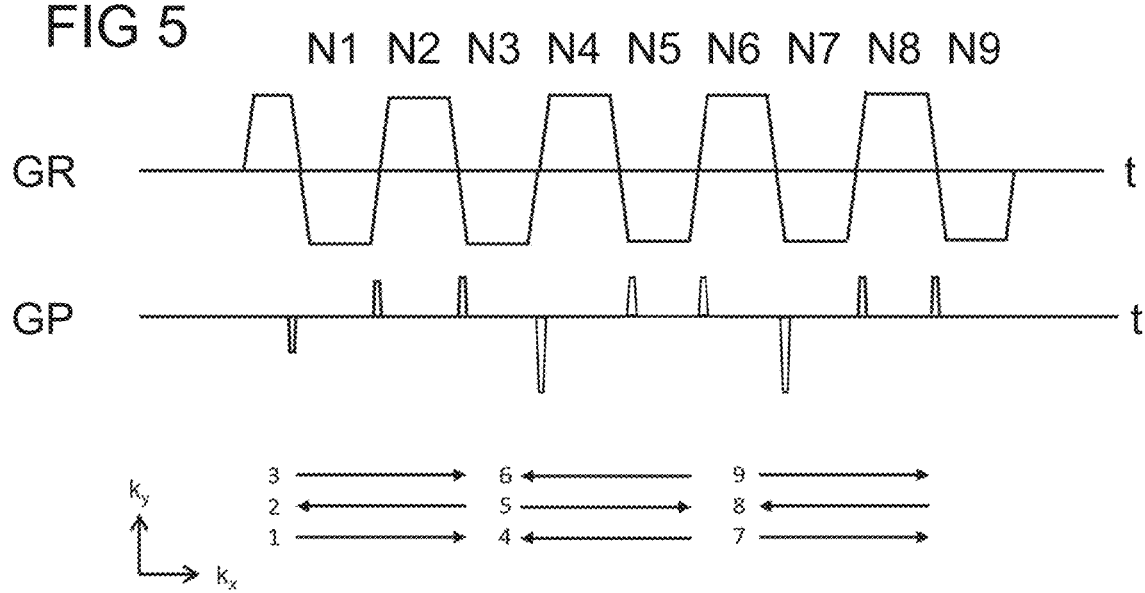

The two examples in FIGS. 4 and 5 may each represent a portion of an example readout train of a dummy scan, which is carried out to establish a steady state before the execution of the actual scan in a repetition of the EPI-SMS pulse sequence scheme.

It is also conceivable that the examples of FIGS. 4 and 5 each show a portion of a repetition of an EPI SMS pulse sequence, which is arranged temporally between an RF excitation pulse and the train of echo signals that is associated with the RF excitation pulse and is acquired as scan data.

In both cases, all the navigator signals necessary for the determination of the slice-specific correction data are recorded within a repetition time of the EPI-SMS technique, with which the scan data to be corrected is also recorded. Influences by way of movements or further phase effects are therefore avoided.

FIG. 4 shows a first example of a portion of an EPI-SMS pulse sequence scheme in which navigator signals N1, N2, N3, N4, N5, N6, N7, N8, and N9 are recorded. Therein, as is usual in EPI techniques, a bipolar readout gradient is switched in the readout direction GR, wherein for each "plateau" of the readout gradient, a navigator signal is recorded. The phase-encoding gradients switched for phase encoding of the navigator signals N1, N2, and N3 in the phase-encoding direction GP have the result that the navigator signals N1, N2, and N3 are acquired in k-space along the k-space rows 1, 2, and 3 offset in the phase-encoding direction ky into the directions (kx) determined by the polarity of the respective readout gradients and indicated by the arrow tips. Due to the fact that no phase-encoding gradient is switched between the navigator signal N3 and the navigator signal N4, but that the polarity of the readout gradient is reversed, the navigator signal N4 is acquired along the same k-space row as the navigator signal N3 but in the opposite direction. Overall, the selected phase-encoding has the result that the three k-space rows spaced apart in the ky direction as shown are each sampled three times by means of the navigator signals N1 to N9, wherein the sampling direction changes as described. This is illustrated beneath the pulse sequence scheme, where the k-space rows are illustrated and are identified with digits corresponding to the navigator signals. For the sake of clarity, the successive samplings are shown adjoining one another, although it is clear that the k-space rows 1, 6, and 7, and 2, 5, and 8, and also 3, 4, and 9 each represent the same k-space row (although possibly with a different sampling direction).

FIG. 5 shows a further example of a portion of an EPI-SMS pulse sequence scheme in which navigator signals N1, N2, N3, N4, N5, N6, N7, N8, and N9 are recorded and differs from that shown in FIG. 4 only by way of a different switching of the phase-encoding gradient. The representation is similar to that in FIG. 4. By way of the phase encoding shown in FIG. 5, k-space is evenly passed through in each case, so that successively recorded navigator signals never have the same phase encoding. The evenness in the sampling that is achievable can lead to an improvement in the phase adjustment. At the same time, however, more and stronger gradients are to be switched for the phase-encoding. Herein, the k-space rows 1, 4, and 7, and 2, 5, and 8, and also 3, 6, and 9 each represent the same k-space row.

For a determination of slice-specific correction data for correcting N/2 ghosts, it would be sufficient in both the examples of FIGS. 4 and 5 to record just the navigator signals N1 to N6, since they already result in one navigator signal for each polarity (of the readout gradient) and for each applied phase-encoding (position in the ky-direction).

By way of the further recording of the navigator signals N7 to N9, however, the method described in U.S. Pat. No. 6,043,651 mentioned above for correcting N/2 ghosts from three (single-slice) navigator signals can be applied similarly for the navigator signals according to the disclosure in that a mean value of the navigator signals N1, N2, N3 and N7, N8, N9 is formed.

In the method described in U.S. Pat. No. 6,043,651, the averaging of the first and third navigator signals leads to this averaged navigator signal having an echo time corresponding to the second navigator signal. For the k-space rows shown in FIG. 5 with the identical sampling, this is also the case, but not for the k-space rows of FIG. 4, wherein for example averaged k-space rows 3 and 9 have an echo time corresponding to the k-space row 6, but must be processed with the k-space row 4. However, with the sampling scheme of FIG. 4, a mean echo time of the averaged k-spaces of the k-space rows 1 to 3 and 7 to 9 further corresponds to a mean echo time of the k-space of the k-space rows 4 to 6, so that here also good results for the correction data can be expected.

The k-spaces represented in relation to FIGS. 4 and 5, in which navigator signals are recorded, each have three k-space rows. However, this is provided by way of example and not limitation, and should not be understood as restrictive. Rather, a number of different phase-encodings and therefore different k-space rows are selected according to a desired effect. If, for example, from the slice separation reference scan data sR recorded, a 5×5 slice-GRAPPA kernel (see the cited article by Breuer et al.) is determined for separating the individual slices, it can be useful to use five different phase encodings in the recording of the navigator signals. The number of the k-spaces that are filled with navigator signals can also be selected according to the timespan available within the repetition time TR of the EPI SMS pulse sequence used. For instance, if the recording of the navigator signals takes place in the context of a dummy scan, significantly more than three k-spaces can be filled with navigator signals. This enables further averagings and possibly specifically determined correction data for different sites in the readout train.

It is therefore conceivable that for at least one possible polarity, two or more navigator signals are recorded for each different phase encoding used, for example, in order to be able to apply the method described in U.S. Pat. No. 6,043,651 similarly, or to enable an averaging of the navigator data, or to be able to determine dedicated correction data in a targeted manner for different sections of the readout train, for example, also with a sliding window approach. This can serve, for instance in the case of eddy current effects, for a further improvement of the correction.

For one polarity, navigator signals Nav recorded more than once can be averaged (block 313).

The navigator signals Nav simultaneously recorded for the at least two slices are separated using the slice separation reference scan data sR into single-slice navigator signals eNav of each of the at least two slices, by which means central k-space rows of different polarity are obtained for each slice as single-slice navigator signals eNav (block 307).

For example, if an averaging of navigator signals Nav recorded more than once for one polarity has not already been carried out, then single-slice navigator signals eNav associated with navigator signals Nav recorded more than once for one polarity can be averaged (block 315).

From the single-slice navigator signals eNav, slice-specific correction data sKor is determined (block 309).

For example, correction data sKor for correcting N/2 ghosts on the basis of single-slice navigator signals eNav of different polarity can be determined, for example, as described in U.S. Pat. No. 6,043,651.

Additionally or alternatively, correction data sKor for correcting drift on the basis of single-slice navigator signals eNav of the same polarity can be determined.

For this purpose, for example, as described in relation to FIGS. 4 and 5, correction data can be determined from k-space rows eNav with the same polarity and phase-encoding of a slice with a DORK method, separated from the navigator signals 1, 2, 3 and 7, 8, 9 recorded at different time points, into single-slice navigator signals, as previously described, for example, in the aforementioned U.S. Pat. No. 9,329,254.

If, in the examples of FIGS. 4 and 5, only six navigator signals N1 to N6 are recorded, correction data can be determined for correcting drift effects, for example, from navigator signals of the same polarity and the same phase encoding repeatedly recorded in different repetition times TR of the EPI SMS pulse sequence used.

A repeated recording of navigator signals can further be used, for example, to determine dynamically-updated correction data. This is useful, for example, to counteract thermal influences.

Scan data MD to be corrected, for example from an acquired scan dataset MDS, is corrected by means of the slice-specific correction data sKor (block 311), wherein distortion-free image data BD can be reconstructed from the corrected scan data.

Figure 6:
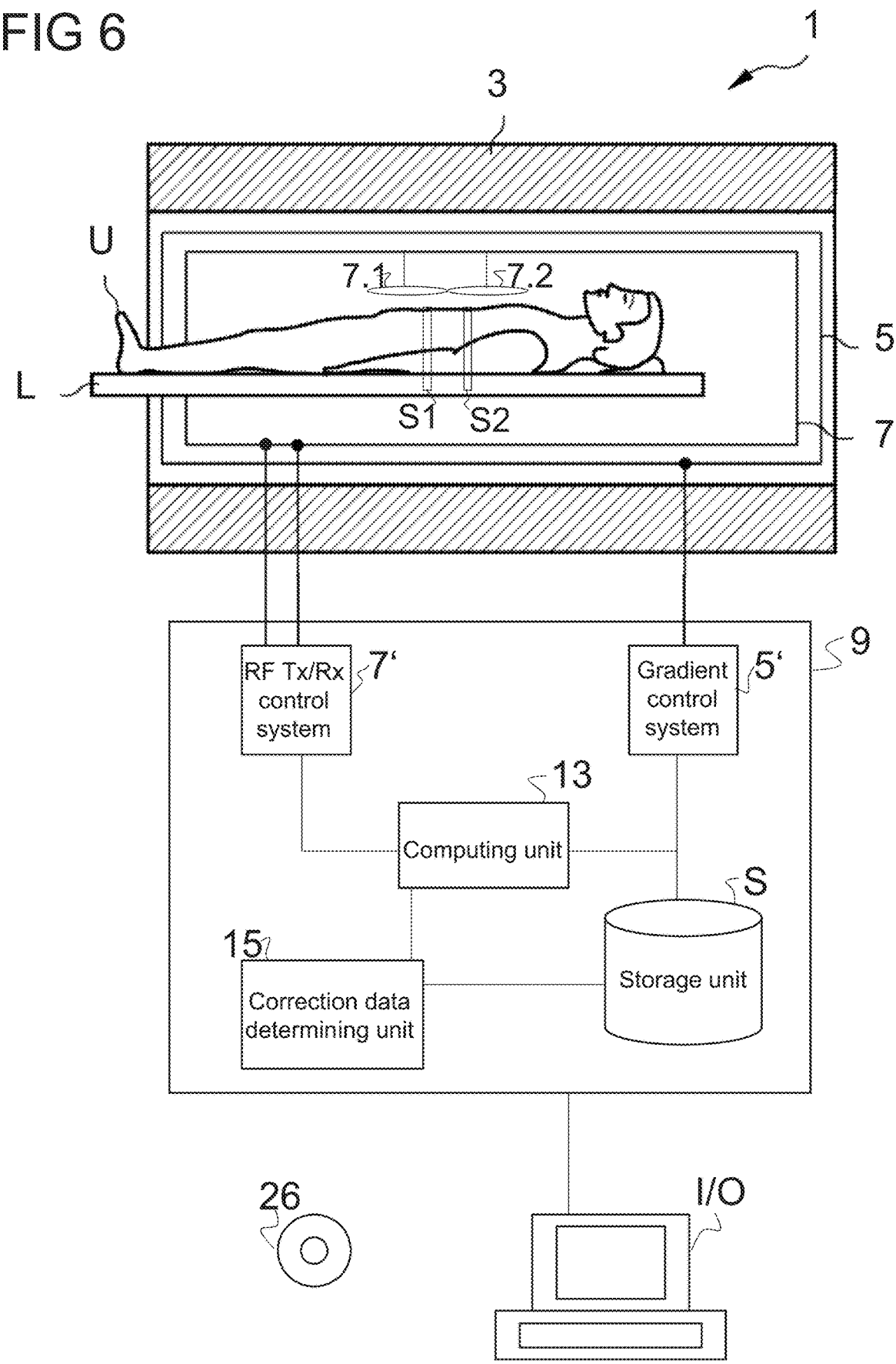
FIG. 6 illustrates a schematic representation of an example magnetic resonance system according to the disclosure.

FIG. 6 shows schematically a magnetic resonance system 1 according to the disclosure. This comprises a magnet unit 3 (also referred to herein as a magnet or main magnet) for generating the main magnetic field, a gradient unit 5 (also referred to herein as a gradient circuitry or a gradient generator) for generating the gradient fields, a radio-frequency (RF) unit 7 (also referred to herein as a RF circuitry) for radiating in and receiving RF signals and a control apparatus 9 (also referred to herein as a controller, control circuity, or a control computer) configured for carrying out a method according to the disclosure.

In FIG. 6, subunits of the magnetic resonance system 1 are shown schematically. For example, the RF unit 7 may comprise a plurality of subunits, for example, a plurality of coils such as the schematically shown coils 7.1 and 7.2, for instance, or more coils which can be configured either to only transmit RF signals or to only receive the triggered RF signals, or for both.

To examine an examination object U, for example, a patient or a phantom, the object U may be introduced on a support L into the magnetic resonance system 1, in the scanning volume thereof. The slices S1 or S2 represent an exemplary target volume of the examination object U from which echo signals are to be recorded and captured as scan data.

The control apparatus 9 serves to control the magnetic resonance system 1 and may, for instance, control the gradient unit 5 by means of a gradient control system 5' (also referred to herein as gradient control circuitry or a gradient controller) and the RF unit 7 by means of a RF transmitting/receiving control system 7' (also referred to herein as an RF control circuitry or an RF controller). The RF unit 7 can herein comprise a plurality of channels on which signals can be transmitted or received.

The RF unit 7 is responsible, together with its RF transmitting/receiving control system 7' for the generation and radiating-in (transmission) of a high-frequency alternating field for manipulation of the spins in a region to be manipulated (for example, in slices S1, S2 to be scanned (simultaneously)) of the examination object U. Herein, the center frequency of the high-frequency alternating field, also designated the B1 field, is typically adjusted so that, as far as possible, it lies close to the resonance frequency of the spin to be manipulated. Deviations of the center frequency from the resonance frequency are referred to as off-resonance. To generate the B1 field, in the RF unit 7, applies currents to the RF coils, which are controlled by means of the RF transmitting/receiving control system 7'.

Furthermore, the control apparatus 9 comprises a correction data determining unit 15 (also referred to herein as correction data determining circuitry or a correction data determiner) with which correction data according to the disclosure for correcting phase errors in scan data recorded by means of an EPI-(SMS) technique can be determined. The control apparatus 9 is configured overall to carry out any of the methods according to the disclosure.

A computing unit 13 (also referred to herein as a computer, computing circuitry, or processing circuitry) included in the control apparatus 9 is configured to carry out all the computation operations necessary for the required scans and determinations. Intermediate results and results needed for this or established herein can be stored in a storage unit S of the control apparatus 9. The units mentioned are herein not necessarily to be understood as physically separate units, but represent merely a subdivision into units of purpose which, however, can also be realized, for example, in fewer, or even only in one single, physical unit.

By way of an input/output apparatus I/O of the magnetic resonance system 1, for example, control commands can be passed by way of a user to the magnetic resonance system and/or results from the control apparatus 9 such as, for example, image data can be displayed.

A method described herein may also be implemented in the form of a computer program product, which comprises a program and implements any of the described methods on the control apparatus 9 when said program is executed on the control apparatus 9. An electronically readable data carrier 26 with electronically readable control information stored thereon can also be provided, said control information comprising at least one computer program product as described above and being configured to carry out any of the described methods described herein when the data carrier 26 is used in the control apparatus 9 of a magnetic resonance system 1 or other suitable component(s) of the magnetic resonance system 1.

The various components described herein may be referred to as "units" or "systems." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units or devices, as applicable and relevant, may alternatively be referred to herein as "circuitry," "controllers," "processors," or "processing circuitry," or alternatively as noted herein.

What is claimed is:

1. A method, comprising:
performing, via a controller of a magnetic resonance apparatus, a slice-specific correction of scan data recorded by the magnetic resonance apparatus for at least two slices simultaneously of an examination object via an echo-planar imaging (EPI) simultaneous multi-slice (SMS) technique by:
recording slice separation reference scan data;
generating scan data to be corrected by, following an RF excitation pulse of the generation of a train of a plurality of echo signals in a number N, wherein N is at least two, of different slices of the examination object, and recording each respective one of the plurality of echo signals while switching gradients with an alternating polarity for successive echo signals, wherein one of N different phases is applied to each of the successive echo signals;
acquiring the simultaneously recorded echo signals for the at least two slices as scan data in a scan dataset;
recording phase-encoded navigator signals simultaneously for the at least two slices temporally after an RF excitation pulse is radiated into the examination object and temporally before the recording of scan data to be corrected;
wherein at least one navigator signal is recorded for each possible polarity and for each different phase-encoding of the navigator signals that is used;
separating the phase-encoded navigator signals simultaneously recorded for the at least two slices into single-slice navigator signals of each of the at least two slices using the slice separation reference scan data;
determining slice-specific correction data from the single-slice navigator signals; and
correcting scan data that is to be corrected via the slice-specific correction data.

2. A magnetic resonance system, comprising:
a main magnet;
a gradient unit;
a high-frequency unit; and
a control apparatus comprising:
a high-frequency transmitting/receiving control system; and
a correction data determining unit,
wherein the control apparatus is configured to perform a slice-specific correction of scan data recorded for at least two slices simultaneously of an examination object via an echo-planar imaging (EPI) simultaneous multi-slice (SMS) technique by:
recording slice separation reference scan data;
generating scan data to be corrected by, following an RF excitation pulse of the generation of a train of a plurality of echo signals in a number N, wherein N is at least two, of different slices of the examination object, and recording each respective one of the plurality of echo signals while switching gradients with an alternating polarity for successive echo signals, wherein one of N different phases is applied to each of the successive echo signals;
acquiring the simultaneously recorded echo signals for the at least two slices as scan data in a scan dataset;
recording phase-encoded navigator signals simultaneously for the at least two slices temporally after an RF excitation pulse is radiated into the examination object and temporally before the recording of scan data to be corrected;
wherein at least one navigator signal is recorded for each possible polarity and for each different phase-encoding of the navigator signals that is used;
separating the phase-encoded navigator signals simultaneously recorded for the at least two slices into single-slice navigator signals of each of the at least two slices using the slice separation reference scan data;
determining slice-specific correction data from the single-slice navigator signals; and
correcting scan data that is to be corrected via the slice-specific correction data.

3. A non-transitory electronically-readable computer-readable medium with electronically readable control information stored thereon which comprises at least one computer program configured to, when the computer-readable medium is executed by a control apparatus of a magnetic resonance system, causes the magnetic resonance imaging system to perform a slice-specific correction of scan data recorded for at least two slices simultaneously of an examination object via an echo-planar imaging (EPI) simultaneous multi-slice (SMS) technique by:
recording slice separation reference scan data;
generating scan data to be corrected by, following an RF excitation pulse of the generation of a train of a plurality of echo signals in a number N, wherein N is at least two, of different slices of the examination object, and recording each respective one of the plurality of echo signals while switching gradients with an alternating polarity for successive echo signals, wherein one of N different phases is applied to each of the successive echo signals;

acquiring the simultaneously recorded echo signals for the at least two slices as scan data in a scan dataset;

recording phase-encoded navigator signals simultaneously for the at least two slices temporally after an RF excitation pulse is radiated into the examination object and temporally before the recording of scan data to be corrected;

wherein at least one navigator signal is recorded for each possible polarity and for each different phase-encoding of the navigator signals that is used;

separating the phase-encoded navigator signals simultaneously recorded for the at least two slices into single-slice navigator signals of each of the at least two slices using the slice separation reference scan data;

determining slice-specific correction data from the single-slice navigator signals; and correcting scan data that is to be corrected via the slice-specific correction data.

4. The method as claimed in claim 1, wherein the phase-encoded navigator signals are recorded temporally between an RF excitation pulse and the train of echo signals associated with the RF excitation pulse.

5. The method as claimed in claim 1, wherein the phase-encoded navigator signals are recorded as part of a dummy scan that is carried out before the generation of the scan data to be corrected, the dummy scan serving to establish a steady state.

6. The method as claimed in claim 1, wherein the phase-encoded navigator signals are recorded within a repetition time TR of an EPI-SMS technique that is used.

7. The method as claimed in claim 1, wherein for at least one polarity, two or more phase-encoded navigator signals are recorded for each different phase-encoding that is used.

8. The method as claimed in claim 7, wherein for one polarity, phase-encoded navigator signals recorded more than once are averaged, or single-slice navigator signals associated with the phase-encoded navigator signals are averaged.

9. The method as claimed in claim 1, wherein the phase-encoded navigator signals are recorded repeatedly to determine updated correction data.

10. The method as claimed in claim 1, wherein successively recorded phase-encoded navigator signals never have identical phase-encodings.

11. The method as claimed in claim 1, wherein the slice-specific correction data for correcting N/2 ghosts based upon single-slice navigator signals of different polarities are determined.

12. The method as claimed in claim 1, wherein the slice-specific correction data for correcting drift based upon the single-slice navigator signals of the same polarity are determined.

13. The method as claimed in claim 1, further comprising:

reconstructing, via the controller of the magnetic resonance apparatus, images from the corrected scan data to provide reconstructed magnetic resonance (MR) images.

14. The method as claimed in claim 13, further comprising:

presenting, via a display of the magnetic resonance apparatus, the reconstructed MR images.

15. The magnetic resonance system as claimed in claim 2, wherein the control apparatus is configured to reconstruct images from the corrected scan data to provide reconstructed magnetic resonance (MR) images.

16. The magnetic resonance system as claimed in claim 15, further comprising:

a display configured to present the reconstructed MR images.

17. The electronically-readable computer-readable medium as claimed in claim 3, wherein, when the computer-readable medium is executed by the control apparatus of the magnetic resonance system, the control information further causes the magnetic resonance imaging system to reconstruct images from the corrected scan data to provide reconstructed magnetic resonance (MR) images.

18. The electronically-readable computer-readable medium as claimed in claim 17, wherein, when the computer-readable medium is executed by the control apparatus of the magnetic resonance system, the control information further causes the magnetic resonance imaging system to present, via a display of the magnetic resonance imaging system, the reconstructed MR images.

* * * * *